(12) United States Patent
Ma

(10) Patent No.: US 7,666,021 B2
(45) Date of Patent: Feb. 23, 2010

(54) SOCKET CONNECTOR ASSEMBLY WITH A HEAT SINK DETACHABLY ATTACHED THEREON

(75) Inventor: Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/283,348

(22) Filed: Sep. 10, 2008

(65) Prior Publication Data

US 2009/0068875 A1 Mar. 12, 2009

(30) Foreign Application Priority Data

Sep. 10, 2007 (CN) .................................. 09621531

(51) Int. Cl.
*H01R 13/62* (2006.01)

(52) U.S. Cl. ...................................... 439/331

(58) Field of Classification Search ................ 439/331, 439/330, 342, 73, 862; 361/704, 719
See application file for complete search history.

(56) References Cited

U.S. PATENT DOCUMENTS

| 6,178,611 | B1 * | 1/2001 | Boe | 29/243.56 |
|---|---|---|---|---|
| 6,442,816 | B1 | 9/2002 | Kao | |
| 7,497,743 | B2 * | 3/2009 | Tsai | 439/862 |
| 7,510,418 | B1 * | 3/2009 | Scott et al. | 439/331 |
| 2008/0045048 | A1 * | 2/2008 | Ma | 439/73 |
| 2008/0153338 | A1 * | 6/2008 | Ju | 439/331 |
| 2008/0220643 | A1 * | 9/2008 | Zhang | 439/331 |

* cited by examiner

*Primary Examiner*—Jean F Duverne
(74) *Attorney, Agent, or Firm*—Andrew C. Cheng; Wei Te Chung; Ming Chieh Chang

(57) ABSTRACT

An electrical connector assembly includes a frame (7) defining a central opening (70) and with a front portion (75) and a rear portion (76), an insulative housing (10 securely disposed within the central opening, a cover (6) having hook portions (61) rotatably assembled in the rear portion of the frame, a lever (3) with a pressing portion (32) pivotally retained to the front portion of the frame to lock the cover against the insulative housing, a heat sink (4) disposed onto the cover and at least one clip (5) for securing the heat sink to the cover. The frame defines locking portions (710, 720) at the front portion and the rear portion thereof, the at least one clip defines a pair of legs (50) and a connecting portion (52) connecting the legs. One leg locks with the locking portion of the front portion and the other leg locks with the locking portion of the rear portion of the frame.

6 Claims, 6 Drawing Sheets

SOCKET CONNECTOR ASSEMBLY WITH A HEAT SINK DETACHABLY ATTACHED THEREON

BACKGROUND OF THE INVENTION

1. Field of the Invention

The present invention relates to an electrical connector assembly, and particularly to a socket connector assembly with a heat sink detachably attached thereon to dissipate heat generated by a CPU mounted within the socket assembly.

2. Description of the Related Art

U.S. Pat. No. 6,442,816 issued to Kao on Sep. 3, 2002 discloses an electrical connector assembly for connecting a CPU (central processing unit) to a circuit board. The electrical connector assembly comprises a socket connector secured at a PCB (printed circuit board), a CPU (central processing unit) assembled in the connector, a heat sink located on a top of the socket connector to dissipate heat generated by the CPU and a clip for securing the heat sink to the socket connector. The socket connector defines an insulative housing having protrusions at opposite sides thereof, and the clip defines through holes at the opposite ends thereof. The clip is retained on the housing by the through holes engaging with the corresponding protrusions to secure the heat sink. But the clip engages with the housing directly, and the connection between the terminals received in the housing and the PCB may be damaged by an excessive engaging force produced by the clip assembling to the housing. Moreover, the clip retained on the housing will force the insulative housing to deform elastically, which also may damage the said connection or the terminals.

Another convention electrical connector assembly includes an insulative housing receiving a plurality of terminals therein, a bottom metal piece and a cover for retaining the housing therebetween, a lever and a clip. The clip for securing a heat sink is retained on the PCB which can prevent the terminals received in the housing from being damaged. But a retaining portion, such as through holes, should be prearranged on the PCB for retaining the clip, which do not satisfy the miniaturization requirement.

Hence, a new design which can secure a heat sink to a CPU mounted on a socket connector is required.

SUMMARY OF THE INVENTION

Accordingly, an object of the present invention is to provide an electrical connector assembly for securing a heat sink by a clip engaging with the frame to protect the terminals received in the connector.

In order to achieve the object set forth, an electrical connector assembly includes a frame defining a central opening and with a front portion and a rear portion, an insulative housing securely disposed within the central opening, a cover having hook portions rotatably assembled in the rear portion of the frame, a lever with a pressing portion pivotally retained to the front portion of the frame to lock the cover against the insulative housing, a heat sink disposed onto the cover and at least one clip for securing the heat sink to the cover. The frame defines locking portions at the front portion and the rear portion thereof, the at least one clip defines a pair of legs and a connecting portion connecting the legs. One leg locks with the locking portion of the front portion and the other leg locks with the locking portion of the rear portion of the frame.

Other objects, advantages and novel features of the invention will become more apparent from the following detailed description of the present embodiment when taken in conjunction with the accompanying drawings.

DETAILED DESCRIPTION OF THE INVENTION

Figure 1:
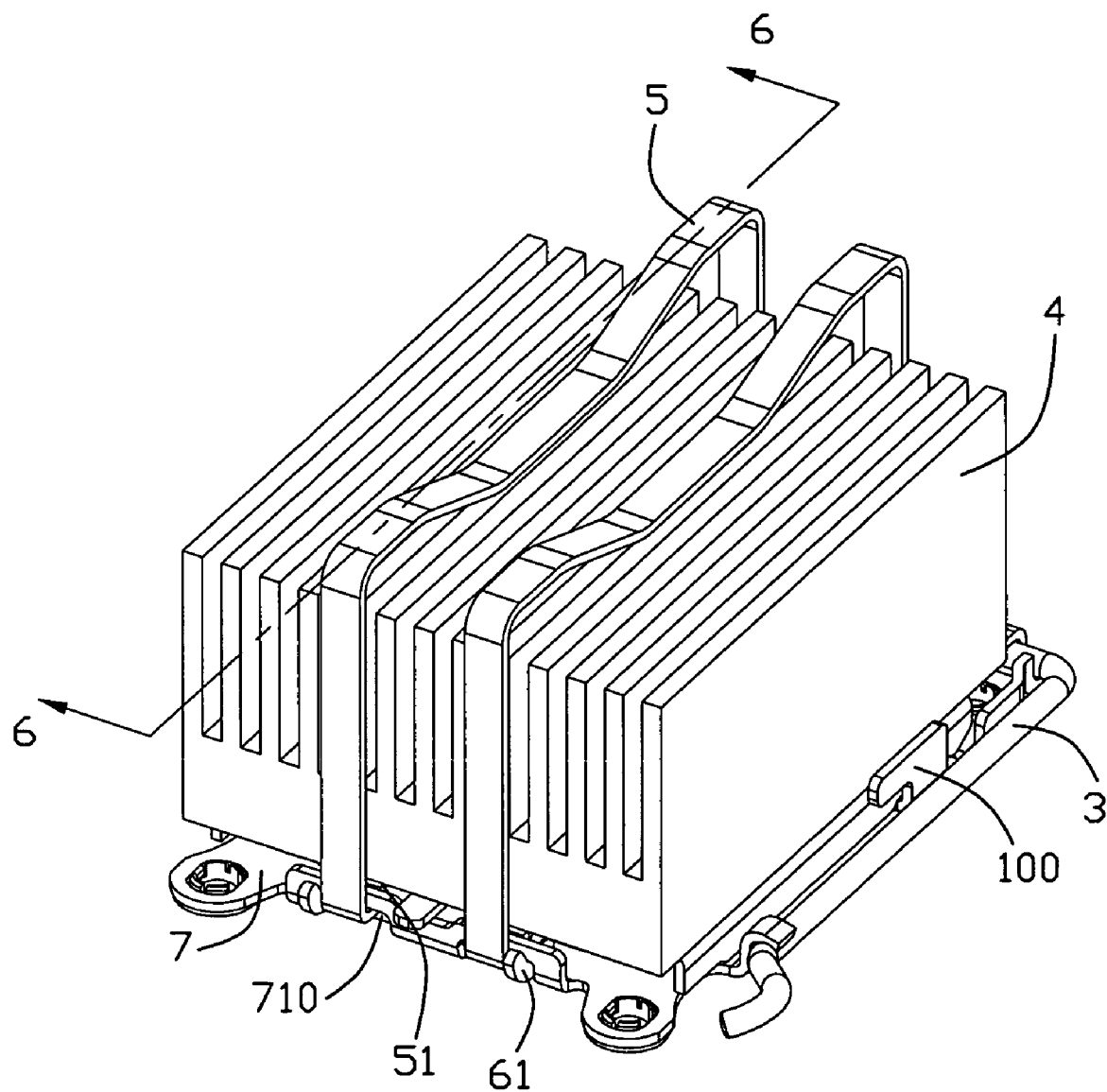
FIG. 1 is a perspective view of an electrical connector assembly in accordance with the present invention.

Reference will now be made to the drawing figures to describe a preferred embodiment of the present invention in detail.

Figure 2:
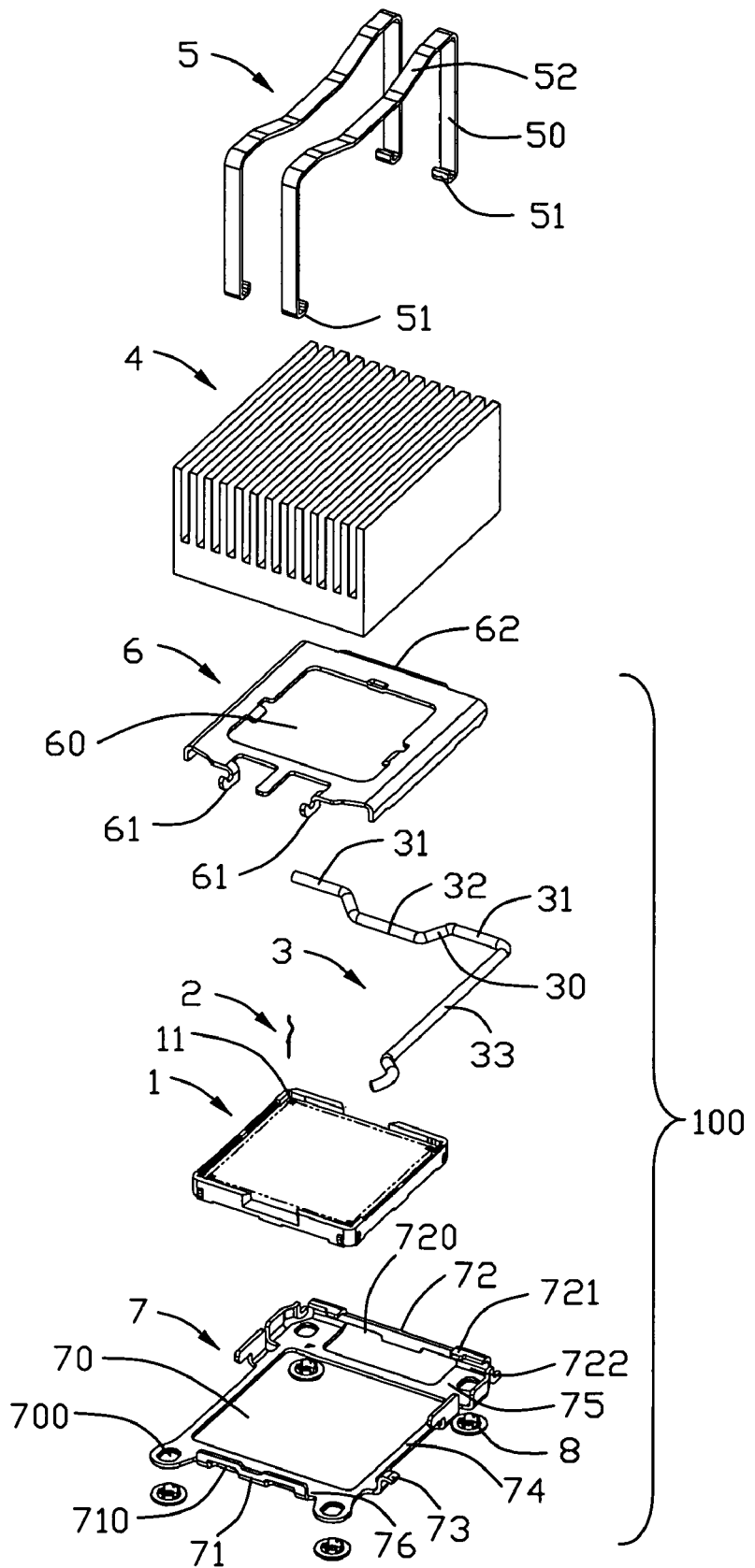
FIG. 2 is an exploded view of the electrical connector assembly shown in FIG. 1.

Referring to FIG. 1, an electrical connector assembly for connection of a CPU and a circuit board, includes a socket connector 100 for receiving the CPU and a heat sink 4 retained on the socket connector by a pair of metal clips 5. Referring to FIG. 2, the socket connector 100 includes an insulative housing 1 receiving a plurality of terminals 2 in corresponding slots 11 defined therein, a retention member 6 and 7 retained on the housing 1 and a lever 3 retained in the retention member.

Figure 3:
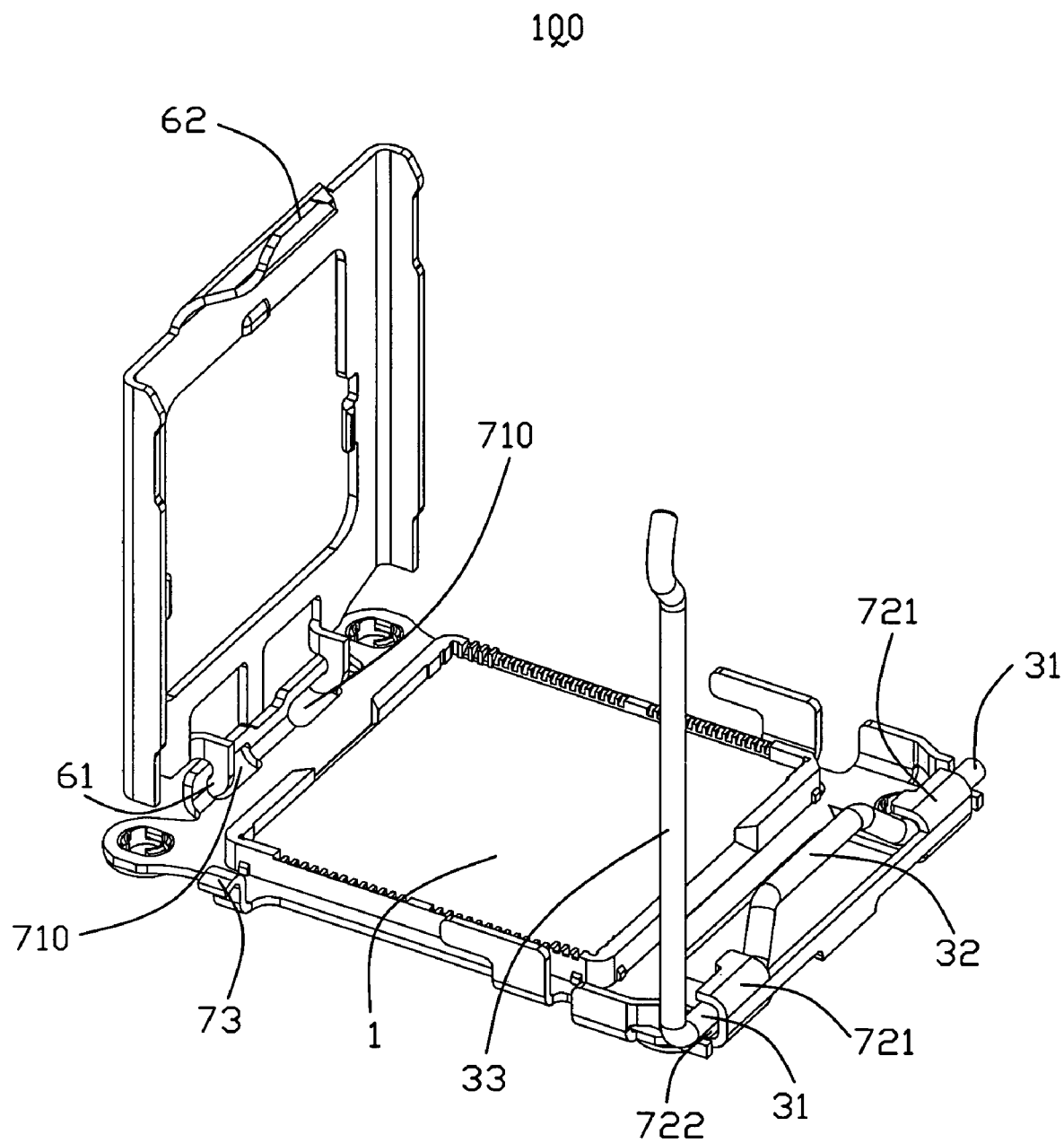
FIG. 3 is a perspective view of an electrical connector in a complete-open state shown in FIG. 1.
Figure 4:
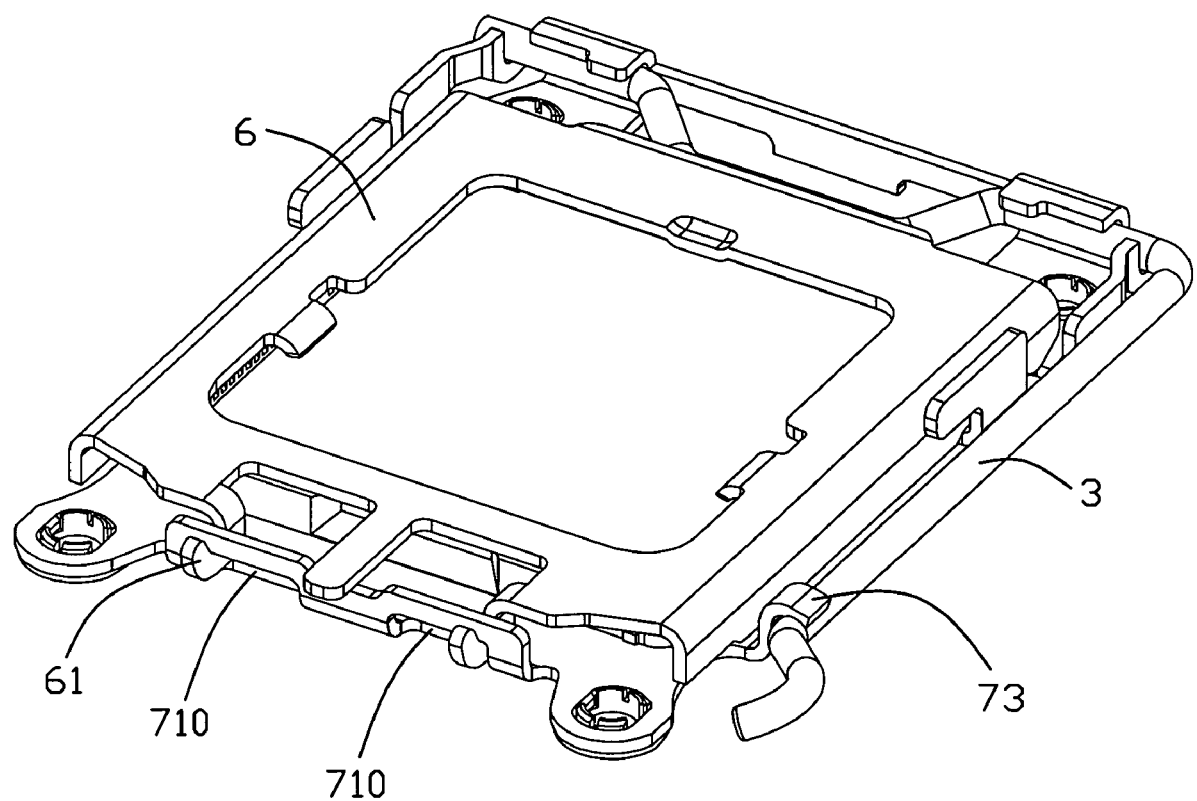
FIG. 4 is a perspective view of an electrical connector in a closed state shown in FIG. 3.
Figure 5:
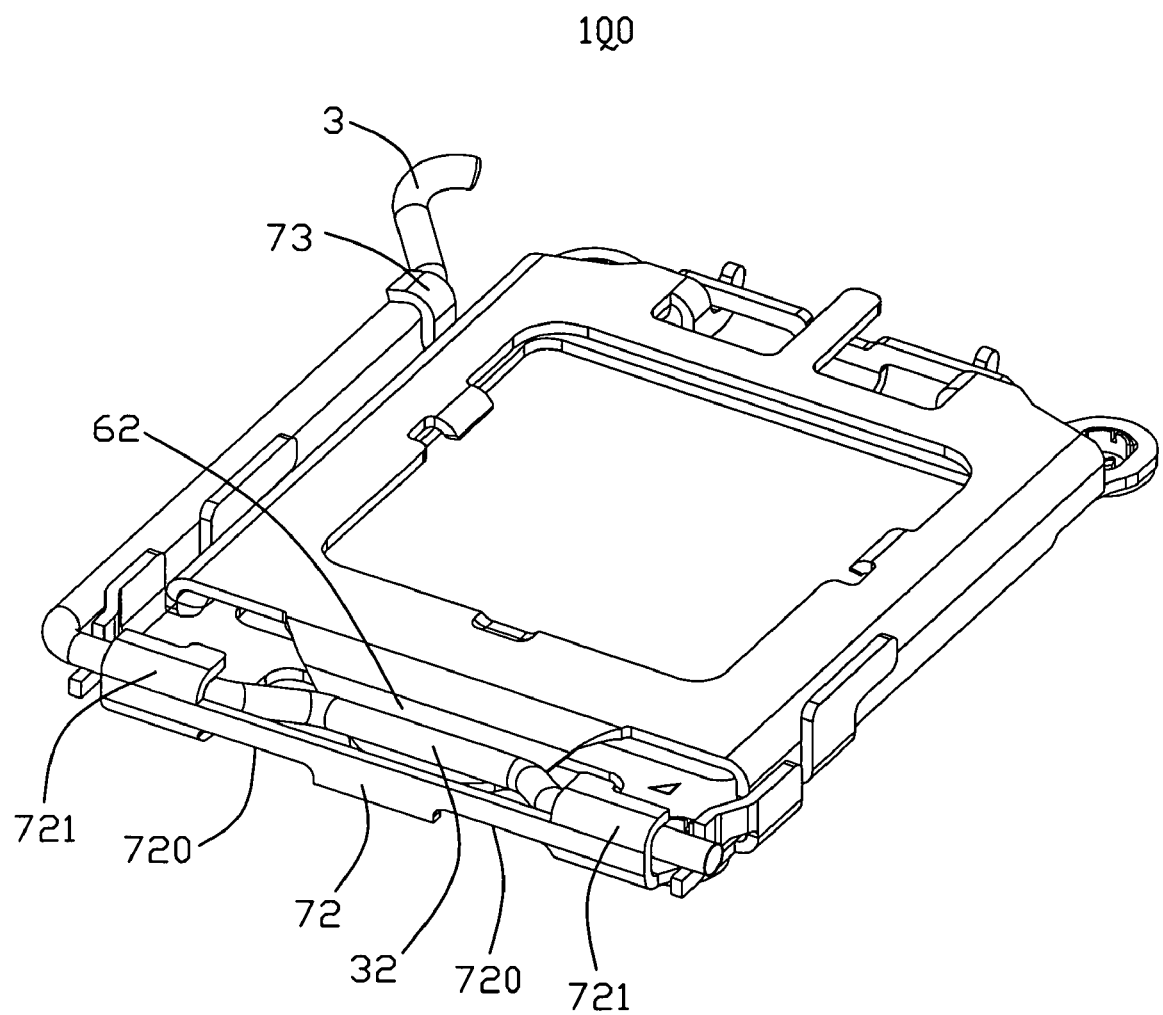
FIG. 5 is another view of the connector shown in FIG. 4.

Referring to FIG. 2, the retention member includes a cover 6 and a frame 7 which are made of metal piece. The rectangular frame 7 defines two opposite side portions 74, a front portion 75 connecting the two side portions 74 at the front thereof and a rear portion 76 opposite to the front portion 75. A first bending portion 71 extends upwards from an outside edge of the rear portion 76, and a second bending portion 72 extends upwards from an outside edge of the front portion 75 opposite to the first bending portion 71. The first bending portion 71 defines a pair of slots 710 arranged abreast thereof, the second bending portion 72 defines a pair of slots 720 arranged abreast and opposite to the slots 710 thereof. The slots 710, 720 which are defined as locking portions run through the corresponding bending portions 71, 72. A pair of blocking portions 721 bends from a top edge at two ends of the second bending portion 72 and extends to the first bending portion 71, a receiving room 722 for receiving the lever 3 is provided. An opening 70 is defined at a central portion of the frame. As shown in FIG. 3, the insulative housing 1 is retained in the frame 7.

As shown in FIG. 2, the cover 6 defines a pair of hook portions at a back end thereof, and a protrusion 62 is defined at a front end opposite to the back end. The cover 6 further defines a second opening 60 at a central portion thereof. The lever 3 is L-shaped and includes a handle and a shaft 30 joined with each other at a right angle. The shaft 30 defines a pair of rollers 31 at two ends thereof and a pressing portion 32 is defined between the two rollers 31. As shown in FIG. 3, the hook portions are inserted into the slots 710 and hook the second bending portion 72 of the frame 7 while rotating. The rollers 31 of the lever 3 is received and retained in the receiving room 722. When the cover 6 rotate to overlap the top of the frame 7 and the housing 1, the handle 33 is also rotated to be under the bending 73, and the pressing portion 32 rotates to press on the protrusion 62 so that the cover is fitly retained on the frame 7. As known, when a CPU (not shown) is received in the frame, the cover 6 is used to nicely retain the CPU in the housing 1 to complete mechanically and electrically engagement of the terminals 2 and pins of the CPU.

Figure 6:
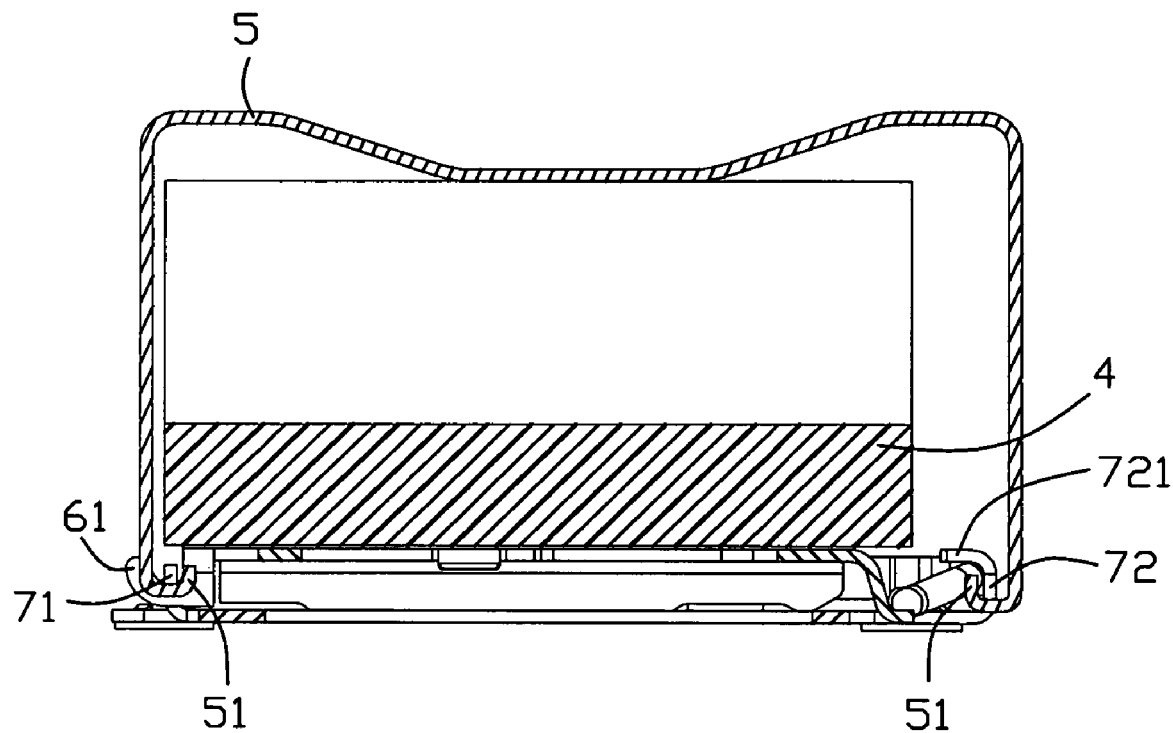
FIG. 6 is a cross sectional view taken along line 6-6 of FIG. 1, showing the engagement of the clip and the frame.

Referring to FIG. 2, each of the clips 5 defines two opposite legs 50 and a connecting portion 52 connecting the two legs 50. The connecting portion 52 bends downwards at middle portion thereof to increase the elasticity of the connecting portion 52 pressing against the heat sink 4. Each of the legs 50 defines an upward barb 51 at the free end thereof. As shown in FIG. 1 and FIG. 6, the heat sink 4 is set on the cover 6 and contacts the CPU through the second opening 60 to transfer heat away from the CPU. The clips 5 bestride on the heat sink 4 and the barbs 51 locks with the corresponding slots 710, 720 so that the heat sink 4 mate with the CPU tightly. Each hook portion 61 of the cover 6 is inserted into one of the slots 710 and is adjacent to one end of the slot 710, one barb 51 of a clip 5 is inserted into the same slot 710 and is adjacent to the other end of the slot 710, the other barb 51 is inserted into a opposite corresponding slots 720. The barbs 51 inserted into the slots 710 are between the two hook portions 61. Four retaining members 8 are received in corresponding through holes 700 defined in four corner of the frame 7, and the electrical connector assembly is retained to the PCB by bolts (not shown) engaging with the retaining members 8.

The clips 5 defined in the present invention are retained to the metal frame 7 instead of being retained to the housing 1, which can prevent the housing 1 from deforming. Moreover, it is no need to prearrange through holes on the PCB to retain the retaining clips 5 as a convention electrical connector assembly, which can satisfy the miniaturization requirement.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:
    a frame defining a central opening and with a front portion and a rear portion, the frame defining locking portions at the front portion and the rear portion thereof, respectively;
    an insulative housing securely disposed within the central opening;
    a cover having hook portions rotatably assembled in the locking portions of the rear portion of the frame;
    a lever with a pressing portion pivotally retained to the front portion of the frame to lock the cover against the insulative housing;
    a heat sink disposed onto the cover; and
    at least one clip for securing the heat sink to the cover, defining a pair of legs and a connecting portion connecting the legs;
    wherein one leg locks with the locking portion of the front portion and the other leg locks with the locking portion of the rear portion of the frame wherein the locking portions are slots defined at the front and rear portions respectively; wherein the at least one clip defines barbs at the free end of the legs, the at least one clip is used to bestride on the heat sink and the barbs lock with the corresponding slots.

2. The electrical connector assembly as described in claim 1, wherein the rear portion defines a pair of slots side by side, one of the hook portions of the cover and one leg of the at least one clip are inserted into a same slot.

3. The electrical connector assembly as described in claim 2, wherein the front portion defines a pair of slots side by side, and the other leg of the at least one clip is inserted into a slot defined in the front portion.

4. The electrical connector assembly as described in claim 1, wherein the cover defines a second opening at a central portion thereof for exposing a CPU.

5. An electrical connector assembly comprising:
    a metallic frame defining a central opening and at least one locking portion beside the opening;
    an insulative housing disposed in the opening and defining an upward receiving cavity with a plurality of contacts extending therein;
    an electronic package disposed in the receiving cavity and mechanically and electrically engaged with the corresponding contacts;
    a metallic cover pivotally mounted upon one side of said frame;
    a metallic lever pivotally mounted upon another side of the frame;
    a heat sink located above the cover and mechanically and thermally engaged with an upper face of the electronic package; and
    at least one metallic clip mounted upon the heat sink with at least one locking leg latched to the corresponding locking portion of the frame so as to have the heat sink, the electronic package and the frame in a tensioned manner wherein said clip has another locking leg opposite to said locking leg for locking to one of said cover and said frame; wherein said another locking leg is latched to the frame; wherein said frame defines an slot into which the locking leg of the clip and a pivotal root of the cover commonly extend; wherein said frame is independently fastened to a printed circuit board on which said housing is seated under a condition that a gap is formed between the housing and the frame so as to have tension from the frame not directly transferred to the housing.

6. The assembly as claimed in claim 5, wherein said pivotal root extends in a vertical plane along a front-to-back direction of the frame so as to occupy less space in the slot in comparison with the corresponding locking leg.

* * * * *